(12) United States Patent
Picalausa et al.

(10) Patent No.: US 9,310,436 B2
(45) Date of Patent: Apr. 12, 2016

(54) SYSTEM AND METHOD FOR SCAN-TESTING OF IDLE FUNCTIONAL UNITS IN OPERATING SYSTEMS

(71) Applicant: OmniVision Technologies, Inc., Santa Clara, CA (US)

(72) Inventors: Jenny Picalausa, Hakadal (NO); Kristoffer Koch, Oslo (NO)

(73) Assignee: OmniVision Technologies, Inc., Santa Clara, CA (US)

( * ) Notice: Subject to any disclaimer, the term of this patent is extended or adjusted under 35 U.S.C. 154(b) by 139 days.

(21) Appl. No.: 14/166,383

(22) Filed: Jan. 28, 2014

(65) Prior Publication Data

US 2015/0212151 A1    Jul. 30, 2015

(51) Int. Cl.
*G01R 31/317* (2006.01)
*G01R 31/3187* (2006.01)
*G01R 31/3185* (2006.01)
*G06F 11/22* (2006.01)
*G06F 11/277* (2006.01)
(Continued)

(52) U.S. Cl.
CPC .... *G01R 31/318544* (2013.01); *G01R 31/3177* (2013.01); *G01R 31/3187* (2013.01); *G01R 31/31703* (2013.01); *G01R 31/31813* (2013.01); *G01R 31/31932* (2013.01); *G01R 31/31935* (2013.01); *G01R 31/318385* (2013.01); *G01R 31/318547* (2013.01); *G01R 31/318555* (2013.01); *G06F 11/2236* (2013.01); *G06F 11/261* (2013.01); *G06F 11/277* (2013.01); *G06F 13/24* (2013.01); *H04L 43/50* (2013.01)

(58) Field of Classification Search
CPC ..................... G01R 31/31703; G01R 31/3187; G01R 31/31932; G01R 31/3177; G01R 31/31813; G01R 31/318385; G01R 31/318544; G01R 31/318555; G01R 31/31935; G06F 11/2236; G06F 11/277; G06F 13/24; G06F 2201/83; G06F 11/261; H04L 43/50
USPC ......... 714/726, 727, 729, 732, 735, 736, 738, 714/739, 742, 15; 710/260; 702/117, 118
See application file for complete search history.

(56) References Cited

U.S. PATENT DOCUMENTS 4,192,451 A * 3/1980 Swerling et al. ............... 714/732
5,410,547 A * 4/1995 Drain ............................ 714/732
(Continued)

OTHER PUBLICATIONS

Radeck, Arithmetical Built-In Self Test for DSP Architectures, May 1997, McGill University, pp. i-x, 1-101.*
(Continued)

*Primary Examiner* — John J Tabone, Jr.
(74) *Attorney, Agent, or Firm* — Lathrop & Gage LLP

(57) ABSTRACT

A system has in an integrated circuit a seed memory coupled to seed a vector generator that provides a vector to at least one scan chain of a first functional unit. A signature generator is configured to generate a signature from scan chain data, the signature is compared to an expected signature in a signature memory. A state memorizer is provided for saving a state of the functional unit and to restore the state of the functional unit as testing is completed. The system also has apparatus configured to determine an idle condition of the functional unit despite a non-idle state of the system; and a control unit configured to operate a test sequence when the functional unit is idle, the test sequence saving a state of the unit, generating vectors and signatures and verifying the signatures, and restoring the state of the unit.

13 Claims, 4 Drawing Sheets

(51) Int. Cl.
*G01R 31/3193* (2006.01)
*G01R 31/3177* (2006.01)
*G01R 31/3183* (2006.01)
*G01R 31/3181* (2006.01)
*G06F 13/24* (2006.01)
*G06F 11/26* (2006.01)
*H04L 12/26* (2006.01)

(56) References Cited

U.S. PATENT DOCUMENTS

| | | | |
|---|---|---|---|
| 5,862,150 A * | 1/1999 | Lavelle et al. | 714/732 |
| 6,990,423 B2 * | 1/2006 | Brown et al. | 702/117 |
| 8,335,881 B2 * | 12/2012 | Welguisz et al. | 710/262 |
| 8,438,442 B2 * | 5/2013 | Morrison | 714/742 |
| 2006/0116840 A1 * | 6/2006 | Hops et al. | 702/117 |
| 2007/0143651 A1 * | 6/2007 | Kiryu | 714/724 |
| 2007/0157059 A1 * | 7/2007 | Tsao et al. | 714/733 |
| 2011/0238878 A1 * | 9/2011 | Welguisz et al. | 710/262 |
| 2011/0239070 A1 * | 9/2011 | Morrison | 714/731 |
| 2012/0159274 A1 * | 6/2012 | Balakrishnan et al. | 714/732 |

OTHER PUBLICATIONS

R. Vijay, "Power Reduction in Scan Based BIST Using BS-LFSR," IEEE—Intl Conference on Advances in Engineering, Science and Management (ICAESM-2012) Mar. 30-31, 2012, pp. 53.

* cited by examiner

SYSTEM AND METHOD FOR SCAN-TESTING OF IDLE FUNCTIONAL UNITS IN OPERATING SYSTEMS

BACKGROUND

Most modern digital systems spend much operating time with some or all major parts of the system idle, or nearly idle. Even fast typists rarely can provide input exceeding one character every 100 milliseconds. Although a cell phone or tablet must maintain a digital-radio listening watch while in "standby", such phones spend most of their lives with display blanked, audio processing circuitry disabled, and camera shut down to conserve battery power. Older "CRT"-based televisions and monitors had vertical and horizontal retrace intervals, during which no video is displayed.

It is desirable to test digital systems periodically, because—as with all other manmade devices—they have been known to fail, both with permanent problems and with sensitivities to operating conditions such as high temperatures, radiation, and weak batteries.

While many digital systems perform at least some self-testing at "boot," or power-up, time, one frustration of many users with many modern devices, including laptop computers, cell phones and similar devices, is the length of time required to "boot" the device.

Scan-chain testing is common in the art. In traditional scan testing, as illustrated in PRIOR ART FIG. 1, a functional unit 100 has a block of logic 102 that must be tested. Typically, all registers and state machines of the unit are separated from logic 102 into a scanable register 104. Scanable register 104 includes scanable "flip-flops" 106, each of which has two modes, a normal operation mode where an input to the flip-flop comes from logic 102, and a scan mode, where the input to the flip-flop comes from another flip-flop in the scanable register; each scanable flip-flop also provides an output into logic 102. In many systems where "D" flip-flops 108 are used, a 2:1 multiplexor 110 may serve to switch a flip-flop from a normal mode to the scan mode. The scanable flip-flops serve as a shift register, known as a scan chain, in scan mode, and as a normal register or set of flip-flops in normal mode.

Typically, a data input 112 is provided to the scan chain from a test mode interface circuit 120, and a data output 114 is provided from the scan chain to the test interface circuit 120.

A common clock 118 at each scanable flip-flop may be used for both modes in some systems, in some systems clock-switching circuitry is provided in test interface circuit 120, and in other systems two clocks are provided for each scanable flip-flop 106, with system clocks disabled during test operation. Typically, test interface circuit 120 brings data and clock signals in to the scan chain from an external tester 122 when test mode is activated, and provides data out to tester 122. Logic block 102 may receive additional inputs 124 from other subsystems or chips, and provide outputs 126 to those subsystems or chips; in many such systems any flip-flop or register associated with those inputs and outputs is typically implemented with scanable flip-flops 106 that are part of the scan chain. In larger systems, there may be more than one scan chain, where test interface circuit 120 includes logic to select an active scan chain from the scan chains provided.

Typically, scan testing is performed during a production test environment, where the system being tested performs no normal operations, and external tester 122 provides a sequence of "test vectors" to exercise logic block 102, the vectors typically include stimuli associated with inputs 124 as well as data for initializing each scanable flip-flop 106 of the scan chain to a desired state. The tester loads each vector into the scan chain and onto inputs 124, switches the scan chain to normal mode for one clock cycle to load outputs of logic 102 into the flip-flops of the scan chain, then switches the scan chain back to scan mode and sequentially reads out data from the scan chain, comparing data read from the scan chain to an expected value. Similarly, outputs 126 are compared to expected values during the clock cycle of normal mode.

Typically, scan testing is not performed during system operation, not even at boot time.

SUMMARY

A system has in an integrated circuit a seed memory coupled to seed a vector generator that provides a vector to at least one scan chain of a first functional unit. A signature generator is configured to generate a signature from scan chain data, the signature is compared to an expected signature in a signature memory. A state memorizer is provided for saving a state of the functional unit and to restore the state of the functional unit as testing is completed. The system also has apparatus configured to determine an idle condition of the functional unit despite a non-idle state of the system; and a control unit configured to operate a test sequence when the functional unit is idle, the test sequence saving a state of the unit, generating vectors and signatures and verifying the signatures, and restoring the state of the unit.

A method of testing a system during operation of the system includes determining that a particular functional unit is idle; selecting a seed and loading the seed into a vector generator; shifting a vector from the vector generator into a scan chain of the functional unit while shifting a previous state of the functional unit into a state memorizer; clocking to capture an output of logic of the functional unit in the scan chain; shifting data from the scan chain into the signature generator and generating a signature; comparing the signature to an expected signature in a signature memory and generating a fail signal on mismatch; restoring the functional unit to the state saved in the state memorizer; and returning the functional unit to normal operation.

DETAILED DESCRIPTION OF THE EMBODIMENTS

Figure 1:
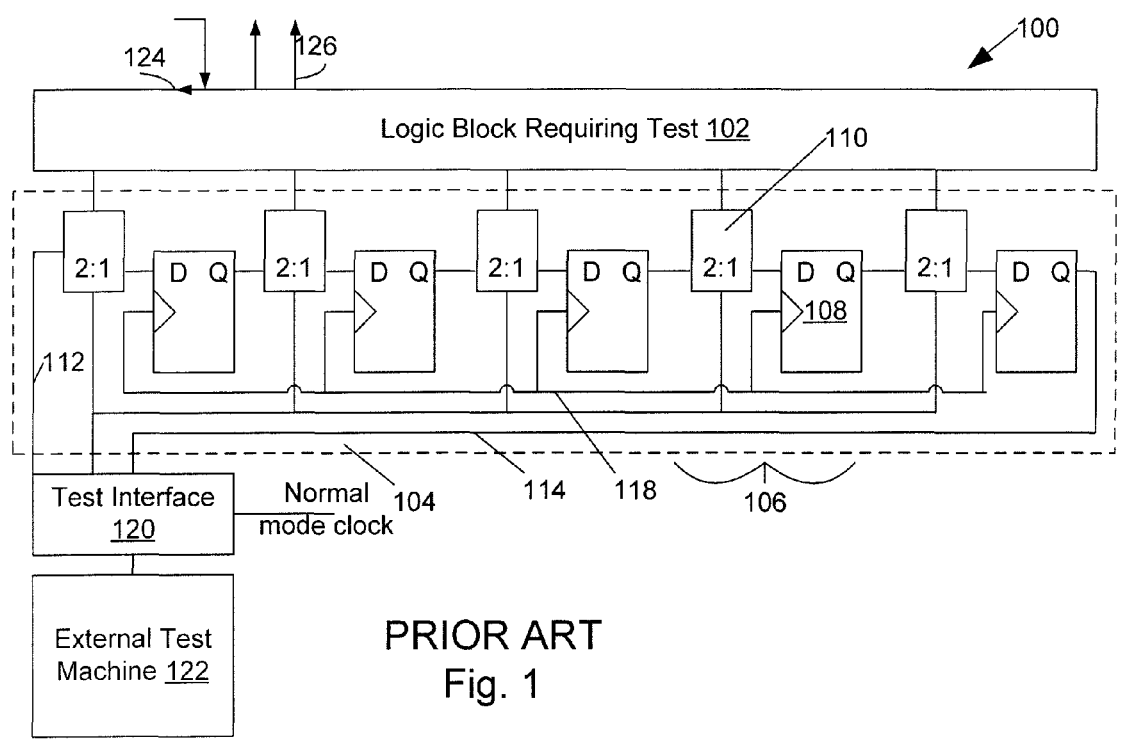
FIG. 1 is a block-level illustration of a PRIOR ART subsystem configured for traditional scan testing.
Figure 2:
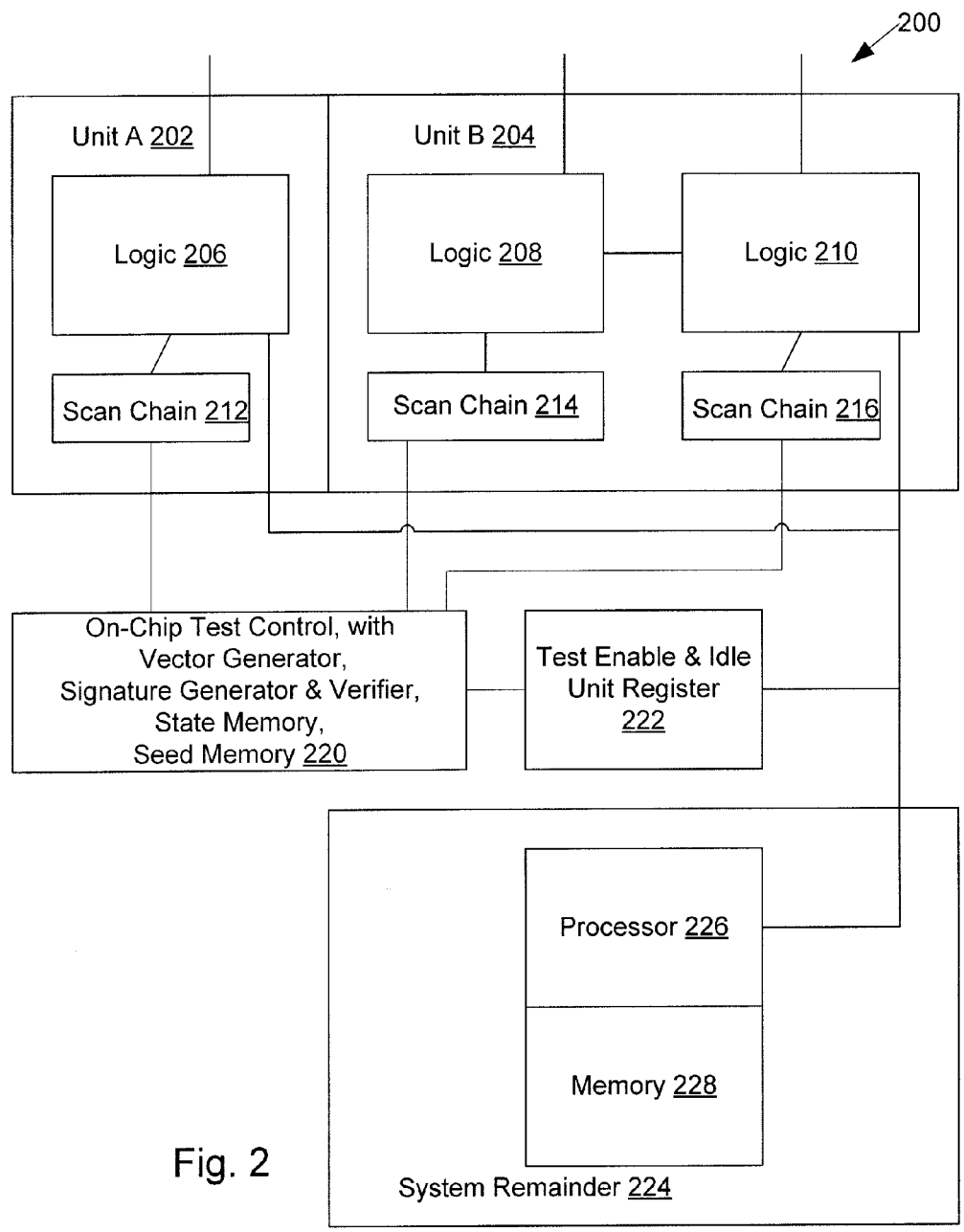
FIG. 2 is a block level illustration of a system having subsystems equipped for scan testing when idle, the scan testing using an internal pattern generator and pattern verification circuitry.
Figure 3:
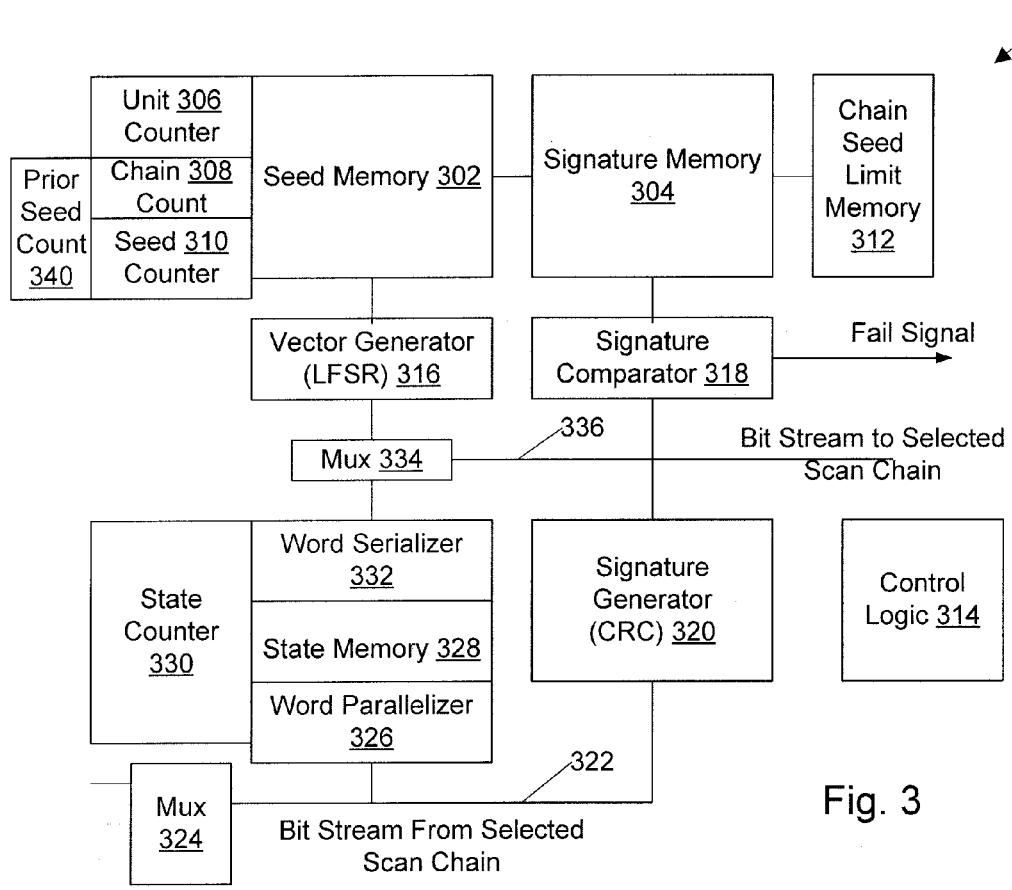
FIG. 3 is a block-level illustration of a scan control and verification unit of the system of FIG. 2.
Figure 4:
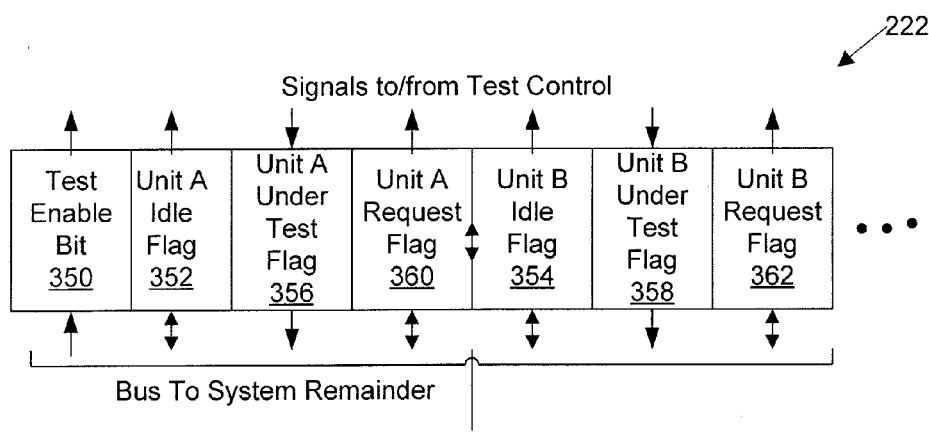
FIG. 4 illustrates two bits of an idle-unit register of the system of FIG. 2.
Figure 5:
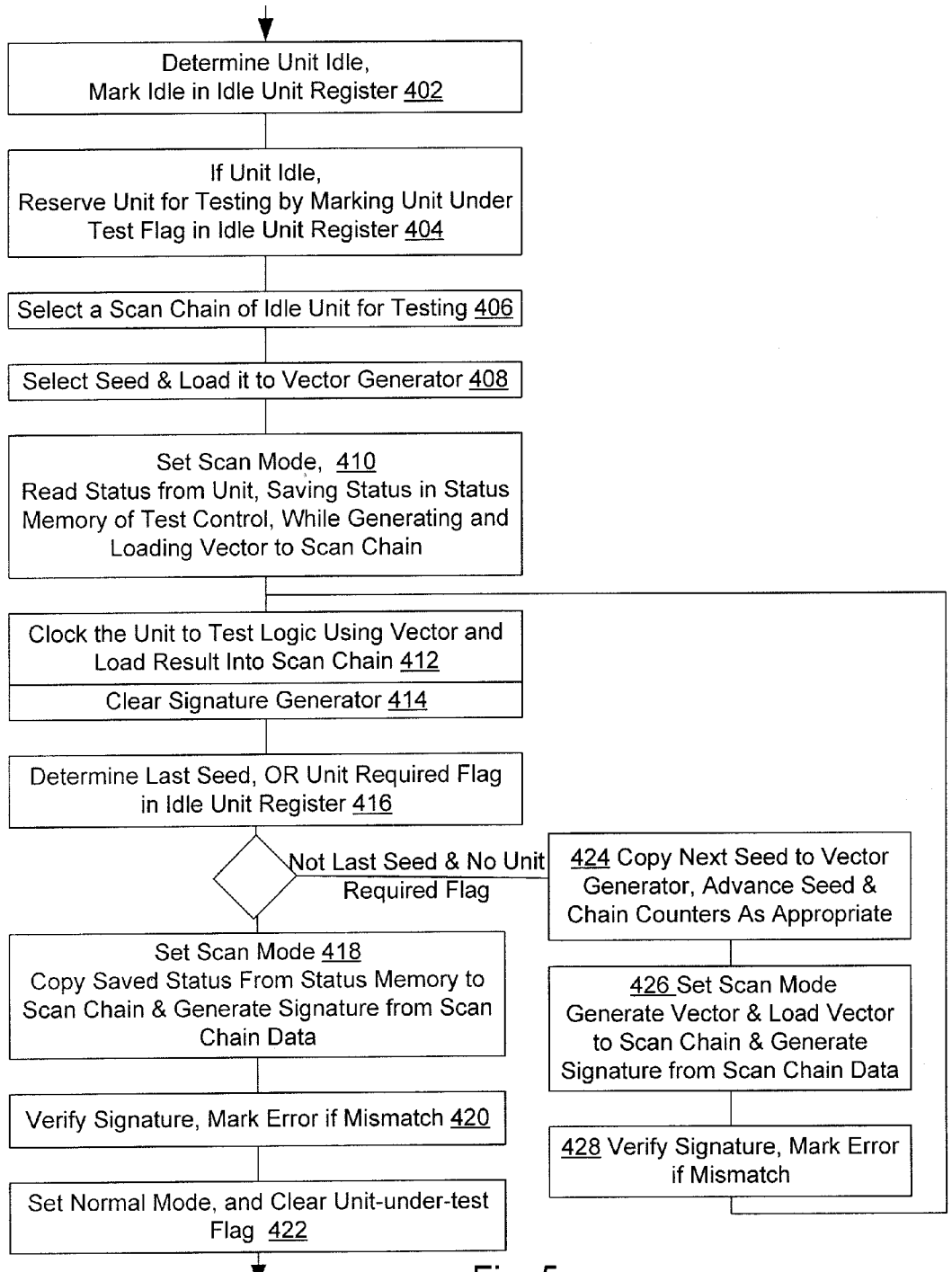
FIG. 5 is a flowchart illustrating operation of the system of FIG. 2 and FIG. 3.

A system 200 (FIG. 2) has one, two, or more units or subsystems 202, 204, each of which is configured for scan testing, with one or more logic sections 206, 208, 210 and one or more scan chains 212, 214, 216 each. There is also an on-chip test control unit 220, with an integral vector generator, signature generator and verifier, state memory, seed memory, and signature memory, the test control unit 220 is configured to operate as described herein and as according to the test controller steps of FIG. 5, and has structure similar to that outlined in FIG. 3. System 200 also has an idle unit register 222 having unit idle, unit request, and unit under test flags as outlined in FIG. 4, and a system remainder 224 having additional functional units that are able to identify particular times during operation that a unit of units or subsystems 202, 204 is idle. In a particular embodiment, system remainder 224 includes a processor 226 and memory 228 with other functional units, although in other embodiments system remainder 224 has additional hardwired logic that performs steps described herein as performed by processor 226.

Test control unit 220 (FIG. 3) has a seed memory 302 and a signature memory 304. The seed and signature memories are addressed by an address generated by concatenating outputs of a unit counter 306, a chain counter 308, and a seed counter 310. In embodiments with only one tested unit, unit counter may be omitted. Similarly, in embodiments with all units having only one chain, chain counter 308 may be omitted. In embodiments with two or more units or two or more chains, a chain and seed count limit memory 312 addressed by the same address is provided to indicate to control logic 314 a limit of a number of chains of a current unit, a limit indicating a number of seeds to use for each particular unit, and a bit count or length of the current chain. Memories 304, 302, 312 may be configured as a single, wide, memory array.

An output of the seed memory 302 is coupled to a vector generator 316 that is configured to generate a lengthy bit sequence, in an embodiment the vector generator is an N-bit linear feedback shift register (LFSR) that is configured to generate a $2^N$-bit pseudorandom sequence when seeded with an N-bit seed from the N-bit-wide seed memory. In a particular embodiment, the LFSR is configured to generate a 2N-bit pseudorandom sequence that is at least as long as the longest scan chain of the system.

An output of the signature memory 304 is coupled to a signature comparator 318 that is configured to compare an expected signature read from the signature memory 304 to a signature generated by a signature generator 320. In an embodiment, signature generator 320 is a second linear feedback shift register configured to generate a cyclic-redundancy check word from a bit-serial sequence, the bit-serial sequence provided by a multiplexor 324 controlled by the unit and chain counters to select as the bit-serial sequence an output of a scan chain, such as scan chain 212, 214, or 216, of a currently selected unit and chain.

The bit-serial sequence from multiplexor 324 also couples to a word parallelizer 326 shift register that provides data to a static RAM state memory 328 and addressed by a state memory address counter 330. An output of state memory 328 couples to a word serializer 332. The assembly of parallelizer 326, state memory 328, address counter 330, and serializer 332, the assembly known herein as a state memorizer, is configured to receive a bit-serial sequence, store that sequence, and regenerate an identical bit-serial sequence at a later time.

A bit-serial sequence from serializer 332 is coupled as an input to multiplexor 334. Multiplexor 334 also has as input the pseudorandom sequence from vector generator 316, and provides a bit stream 336 to the currently-selected scan chain.

Control logic 314 is configured to operate in conjunction with test enable and idle unit register 222. Test control and idle unit register 222 contains a test-enable bit 350 (FIG. 4) that enables operation of the test control unit 220 and is settable by the system remainder 224. Test control and idle unit register also contains, for each unit 202, 204, a unit-idle flag 352, 354 settable by the system remainder 224. The test enable and idle unit register 322 also has, for each unit, a unit under test flag 356, 358, settable by the control logic 3214, and a unit request flag 360, 362 settable by the system remainder 224.

In operation, the system remainder 224 determines 402 (FIG. 5) when a particular functional unit of units 202, 204, is idle, and when that occurs sets the associated unit-idle flag 352, 354 in unit idle register 322. In a camera embodiment, unit 202 may be associated with a photosensor and image compression circuit, while another unit 204 may be associated with a host-interface circuit. Since photographs are typically taken when the camera is not connected to a host computer for uploading and downloading pictures, unit 202 will tend to be idle when unit 204 is busy, and vice-versa. It should be noted that idle condition of a particular functional unit may be detected and set in the unit-idle flags despite a non-idle state of the system as a whole.

Control logic 314 is configured to begin testing when the test enable bit 350 is set and at least one unit-idle flag 352, 354 is set; when this occurs the control unit is configured to select a unit from units 352, 354 for testing, in an embodiment selection is by incrementing unit counter 306 until a unit associated with a current unit count is found idle, the control logic then sets 404 the associated unit-under-test flag 356, 358 to warn the system remainder 224 that the unit is not now available, and clears chain counter 308. Unit-under-test flag 356, 358 is configured to disable operation of the functional unit when set, such that input pins are ignored and outputs of the functional unit remain stable. Control logic 314 selects 406 a scan chain of the unit by incrementing chain counter 308, and clears seed counter 310. A seed selected according to seed counter 310, chain counter 308, and unit counter 306 is read from seed memory 302 to load 408 the vector generator 316 with an initial value. Control logic 314 is configured to place the associated scan chain of the selected unit into scan mode 410, whereupon a current state of the flip-flops of the scan chain are shifted into and saved in the state memory 328 of the state memorizer. Simultaneously a first test vector is generated by vector generator 316 and shifted into the selected scan chain. The selected unit is then clocked 412 to capture an output of the associated logic units 206, 208, 210 in the scan chain, the output of the logic units is dependent on the vector.

The signature generator is cleared 414. Control logic 314 determines 416 if the current seed is the last seed of one or more seeds in seed memory 302 for testing the selected chain of the selected unit, and, if the last seed OR a unit request flag has been set by the system remainder 224, data from memory 328 of the state memorizer is selected by multiplexor 334 as a bit stream to the scan chain and copied to the scan chain 418. This acts to restore the unit state to whatever state the unit was in prior to testing the unit; data restoration occurs simultaneously with data captured from the outputs of logic units being shifted from the selected scan chain into the signature generator. Once the data has been shifted into the signature generator and a signature dependent on the data generated, the signature is verified 420 by comparison in comparator 318 to an output of signature memory 304, and a fail signal generated if there is a mismatch. The control logic 314 then clears 422 the unit under test flag and re-enables normal operation of the unit; the control unit then looks to repeat the process of FIG. 5 for the next scan chain of the same unit if one exists and no unit-request flag is set, or the first chain of the next unit marked idle, or if no unit is marked idle it stops until a unit is marked idle and test is enabled.

It should be noted that each seed in seed memory has a corresponding signature in signature memory, and that each chain of each unit has more than one seed.

If the seed under test was not the last seed AND no unit request flag was set, the next seed is copied into the vector 424 and a new vector is generated and provided by multiplexor 334 as a bit stream to the scan chain. The new vector is generated and shifted 426 into the scan chain simultaneously with data captured from the outputs of logic units being shifted from the selected scan chain into the signature generator. Once the data has been shifted into the signature generator and a signature dependent on the data generated, the signature is verified 428 by comparison in comparator 318 to an output of signature memory 304, and a fail signal generated if there is a mismatch. The sequence then continues by repeating clocking the unit 412 and repeating the process until the last vector seed or unit request flag is set.

The system therefore operates to generate and verify a sequence of vectors, according to seeds provided in the seed memory. The vectors used may be selected from all the possible vectors generatable according to all possible seeds according to a vectors providing best possible fault coverage determined by fault simulations of the system.

In an alternative embodiment, the functions of unit request and unit idle flag are combined, the function of unit request for a given unit being performed by the system remainder 224 clearing the unit idle flag.

Since generating and scanning a vector is time consuming—a 16-bit seed for a 16-bit LFSR can generate a pseudo-random vector 65536 bits long, scan chains occasionally reach lengths of hundreds of bits, typically at least one clock cycle per bit is required for both for generating and shifting a vector into the scan chain and sifting test data out of scan chain into the signature generator, in an alternative embodiment, a prior seed count register 340 is provided for each scan chain of each unit. In this embodiment, when testing of a unit stops because the system remainder 224 has set a unit request or cleared the unit idle flag, the seed counter 310 contents is saved in the prior seed count register. When that unit next begins testing, the prior seed count register 340 is read, incremented, and loaded into the seed counter to ensure testing resumes with the next seed in seed memory past the last one tested. In this way, repeated short unit-idle intervals, such as horizontal retrace intervals in raster-scanned displays, can be taken advantage of to test a functional unit.

In a particular embodiment, the vector generator linear feedback shift register (LSFR) 316 is a bit-swapping linear feedback shift register (BS-LSFR); it is expected that the reduced state transitions in BS-LSFR output compared to LSFR outputs will reduce power required for testing.

In embodiments, the unit-level, idle-time, self test circuitry herein described is implemented on an integrated circuit configured such that one, two, or more units 202, 204, and test control, vector generator, signature generator and signature verifier are on the same integrated circuit. In some of these embodiments, the same integrated circuit may also incorporate processor 226.

It is also anticipated that, in some firmware-driven embodiments, the signature generator 316, and the LSFR 320 of the vector generator, are implemented in hardware, but some or all functions of incrementing prior seed counter 340, seed counter 310, unit counter 306, and chain counter 308, along with seed memory 302, signature memory 304, and signature comparator 318 are implemented in machine-readable instructions of firmware resident in memory 228 of processor 226, along with machine-readable instructions for determining 402 times when particular units are idle in an otherwise functioning system. In these embodiments, storage of prior seed counter 340, seed counter 310, unit counter 306, and chain counter 308 may be implemented in random access memory of memory 228. In these embodiments, processor 226, after determining that a unit is idle and should be tested, determines a suitable seed, configures the LSFR to generate a vector according to the seed, and, after a test is run, compares the generated signature with an expected signature to determine whether a failure has occurred.

In some of these firmware-driven embodiments, state memory 328 may also be implemented as storage in processor-associated memory 228.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A system comprising on one integrated circuit:
   a seed memory coupled to provide a seed to a vector generator,
   the vector generator configured to generate a serial test vector according to the seed;
   at least one scan chain configured to apply data to, and observe data output of, logic of a first functional unit;
   a signature generator configured to generate a signature from observed data from the scan chain;
   a signature comparator configured to compare the signature to an expected signature in a signature memory;
   a state memorizer;
   a test register having at least a unit-idle flag settable by a processor of a system remainder and a unit-under-test flag settable by a test control unit, the test register accessible by the processor of the system remainder, and
   the test control unit being configured to operate a test sequence upon the first functional unit based on the unit-idle flag being set in the test register, the test sequence including setting the unit-under-test flag, using the state memorizer to save a state of the first functional unit, use the vector generator and signature generator with the scan chain to test the logic of the first functional unit, and then using the state memorizer to restore the state of the first functional unit, and then clearing the unit-under-test flag.

2. The system of claim 1 further comprising a second functional unit equipped with a second scan chain, wherein the seed memory comprises separate seeds for the first and second functional units, and wherein the signature memory further comprises separate expected signatures for the first and second functional units.

3. The system of claim 2 further comprising a second unit idle flag and a second unit-under-test flag, wherein testing of the second functional unit is enabled when the second unit idle flag is set, and wherein the second unit-under-test flag is set when the second unit is under test.

4. The system of claim 1 wherein the vector generator is a linear feedback shift register.

5. The system of claim 1 wherein the first functional unit is an image-compression subsystem.

6. A method of testing an idle functional unit of an operating system comprising:
   Identifying in a system remainder an idle functional unit of the system, the idle functional unit coupled to a processor of the system remainder;
   disabling the idle functional unit and marking the idle functional unit as idle by setting a functional unit idle flag;
   in a test controller, determining the idle functional unit is marked idle and testing the idle functional unit, marking the functional unit as under test in a unit-under-test flag readable by the processor of the system remainder; and upon completing the step of testing the functional unit, re-enabling the idle functional unit.

7. The method of claim 6 wherein the step of testing the functional unit comprises using a scan test method, the scan test method further comprising generating a signature from an output of a scan chain and comparing the signature to an expected signature.

8. A method of testing a system during operation of the system comprising:

determining that a particular functional unit of the system is idle and setting a functional unit idle flag in an idle unit register;

selecting a seed and loading the seed into a vector generator;

determining in a test controller that the functional unit idle flag is set in the idle unit register and marking the functional unit as under test in a unit under test in a functional unit under test flag readable by a processor of the system;

shifting a vector from the vector generator into a scan chain of the functional unit while shifting a previous state of the functional unit into a state memorizer;

clocking to capture an output of logic of the functional unit in the scan chain;

shifting data from the scan chain into the signature generator and generating a signature;

comparing the signature to an expected signature in a signature memory and generating a fail signal on mismatch;

restoring the functional unit to the state saved in the state memorizer;

clearing the functional unit under test flag; and returning the functional unit to normal operation.

9. The method of claim 8 further comprising:

determining that a second functional unit is idle;

selecting a seed and loading the seed into the vector generator;

shifting a vector from the vector generator into a scan chain of the second functional unit while shifting a previous state of the second functional unit into the state memorizer;

clocking to capture an output of logic of the second functional unit in the scan chain of the second functional unit;

shifting data from the scan chain of the second functional unit into the signature generator and generating a signature therefrom;

comparing the signature to an expected signature in the signature memory and generating a fail signal on mismatch;

restoring the second functional unit to the state saved in the state memorizer; and returning the second functional unit to normal operation.

10. The method of claim 8 further comprising:

selecting a second seed and loading the second seed into the vector generator;

repeating the steps of shifting a vector into the scan chain, clocking to capture an output, and shifting data from the scan chain into the signature generator; and comparing a second signature from the signature generator to a second signature from the signature memory.

11. The method of claim 8 wherein the vector generator is a linear feedback shift register.

12. The method of claim 11 wherein the linear feedback shift register is a bit-swapping linear feedback shift register.

13. The method of claim 8 wherein the signature generator performs a cyclic redundancy check.

* * * * *